United States Patent [19]

Lorenzini et al.

[11] 4,454,096

[45] Jun. 12, 1984

[54] CRYSTAL GROWTH FURNACE RECHARGE

[75] Inventors: Robert E. Lorenzini; Anthony C. Bonora, both of Atherton; Karl Lorenz, Redwood City, all of Calif.

[73] Assignee: Siltec Corporation, Menlo Park, Calif.

[21] Appl. No.: 273,910

[22] Filed: Jun. 15, 1981

[51] Int. Cl.³ .................................. C30B 15/12
[52] U.S. Cl. ................................. 422/249
[58] Field of Search .................. 422/246, 249; 156/617 SP, 608; 219/300, 301; 13/33; 164/337

[56] References Cited

U.S. PATENT DOCUMENTS

| | | | |
|---|---|---|---|
| 2,459,869 | 1/1949 | Christensen et al. | 156/622 |
| 2,660,769 | 12/1953 | Bennett | 222/146 HE |
| 2,977,258 | 3/1961 | Dunkle | 156/617 SP |
| 3,002,821 | 10/1961 | Haron | 156/608 |
| 3,206,286 | 9/1965 | Bennett, Jr. et al. | 156/617 SP |
| 3,507,625 | 4/1970 | Deyris | 156/617 SP |
| 4,036,595 | 7/1977 | Lorenzini et al. | 156/617 SP |
| 4,282,184 | 8/1981 | Fiegl et al. | 422/106 |

FOREIGN PATENT DOCUMENTS 939102 10/1963 United Kingdom ............... 156/608

Primary Examiner—Hiram H. Bernstein
Attorney, Agent, or Firm—C. Michael Zimmerman

[57] ABSTRACT

Several embodiments of a replenishment arrangement for furnishing molten semiconductor material to furnaces for growing monocrystalline boules are described. A replenishment crucible within which a melt of the material from which the boules are to be grown is communicated either intermittently or continuously with a plurality of growth furnaces.

1 Claim, 7 Drawing Figures

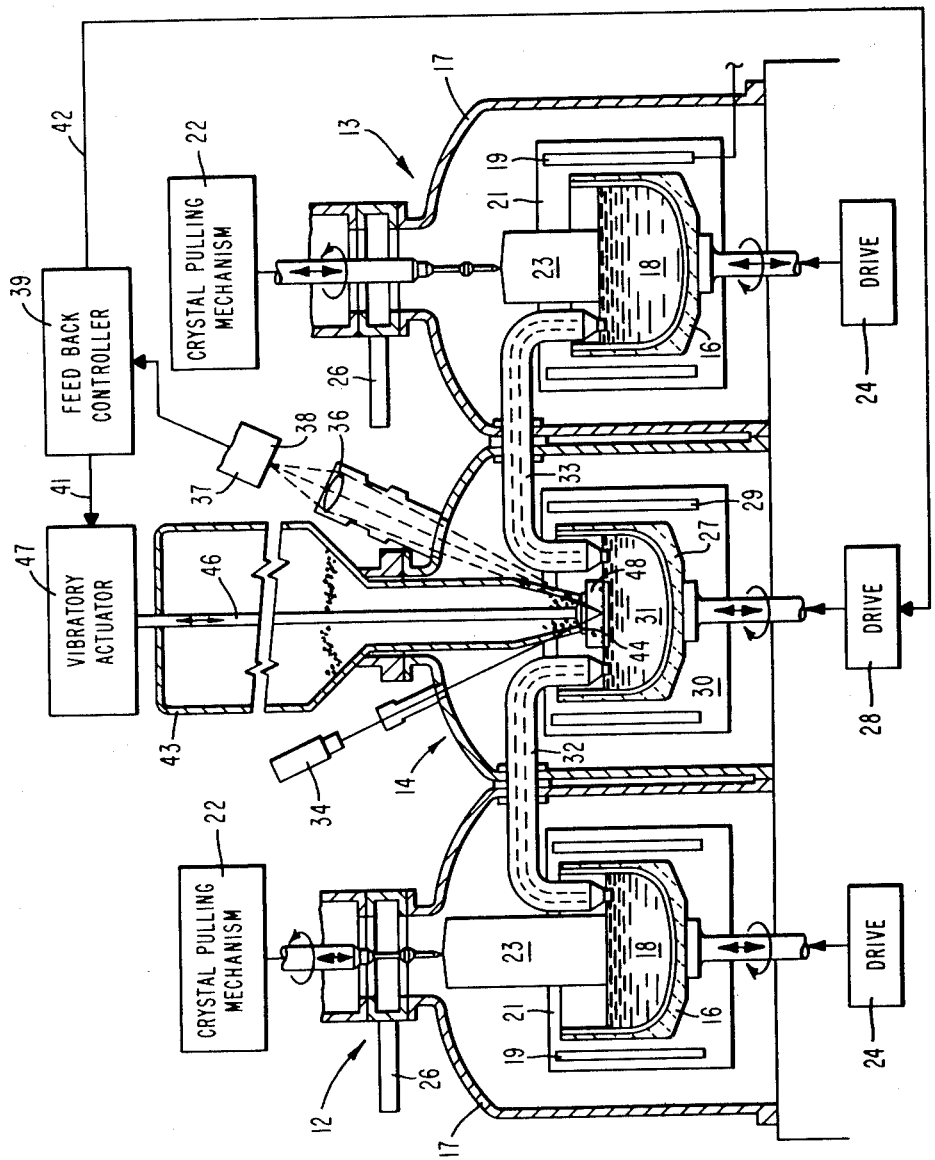
FIG_1

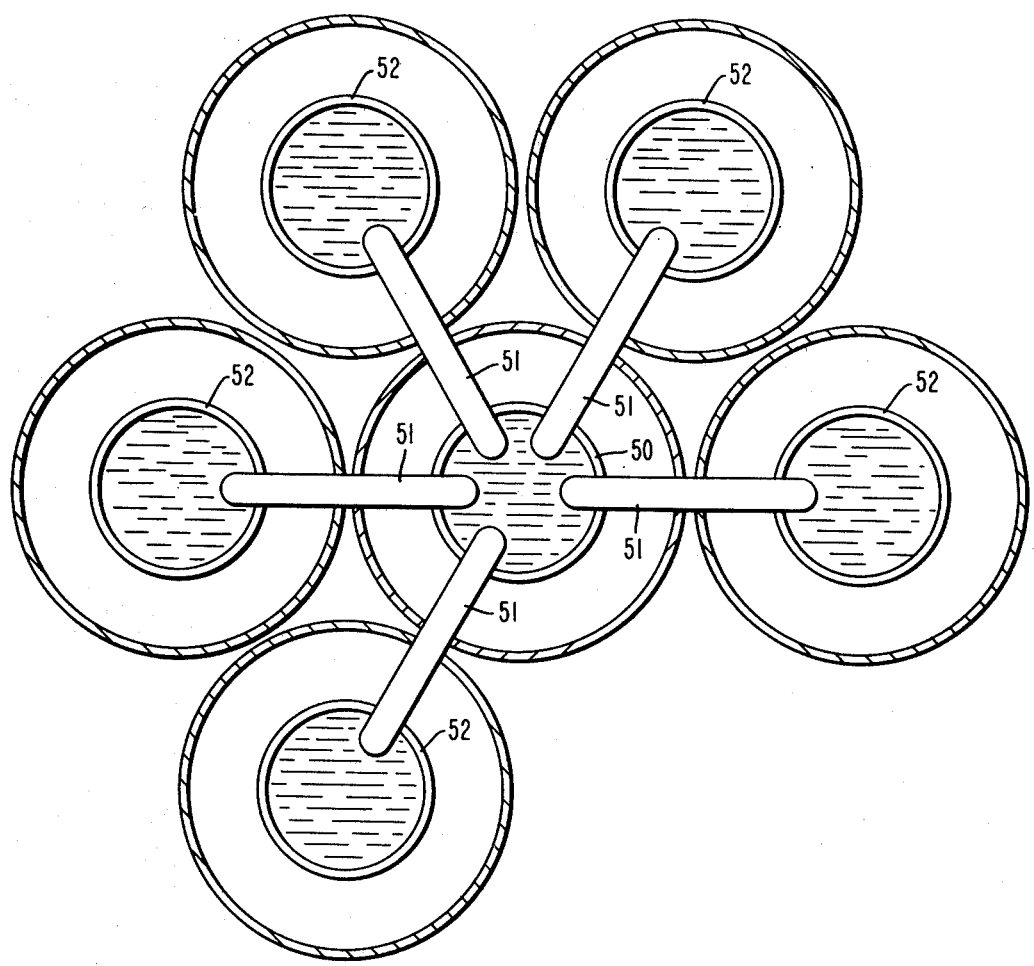
FIG_2
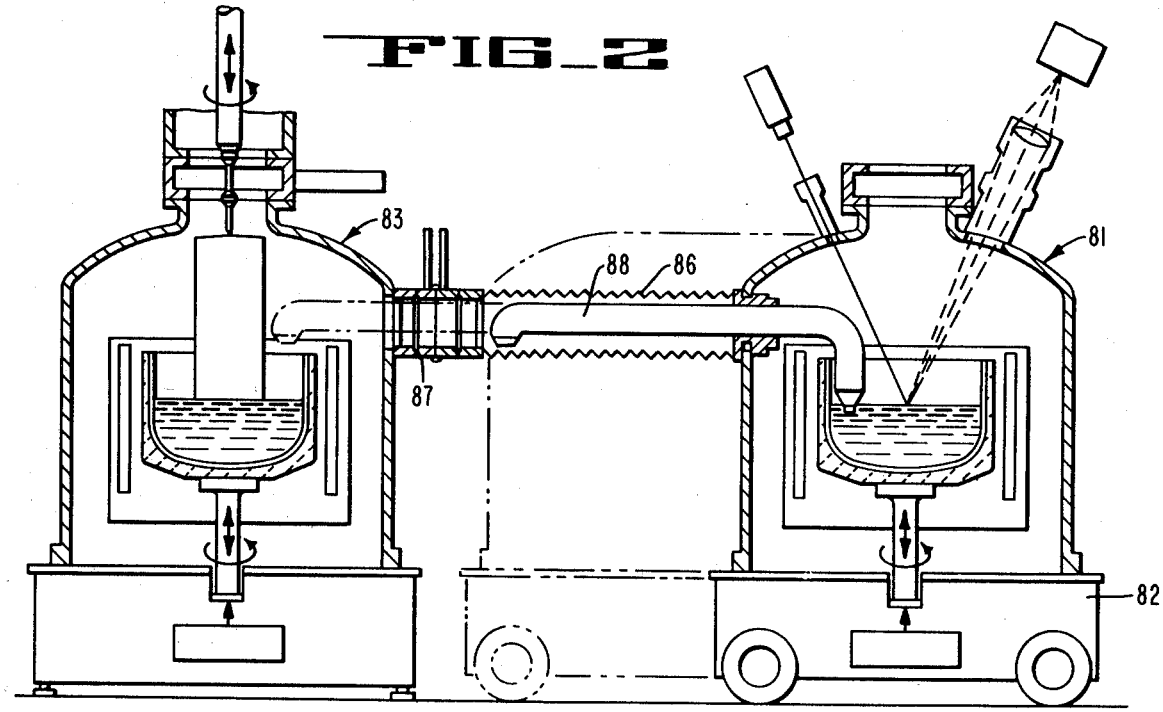
FIG_7

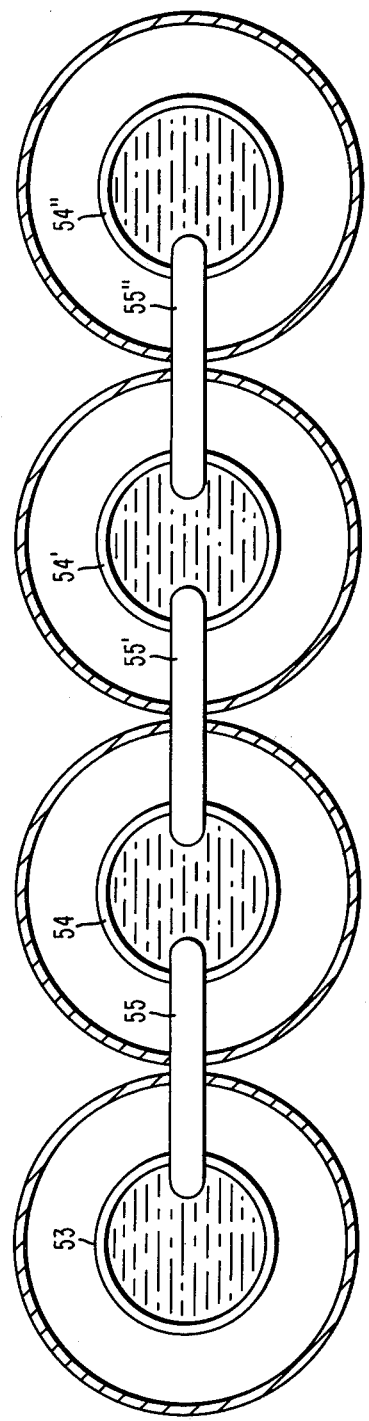

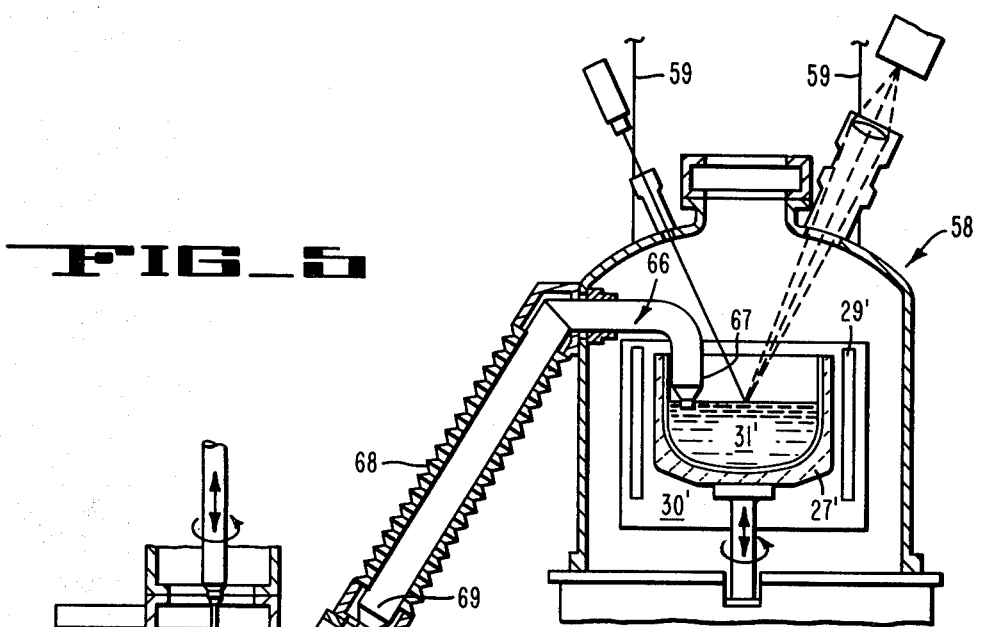
FIG_5
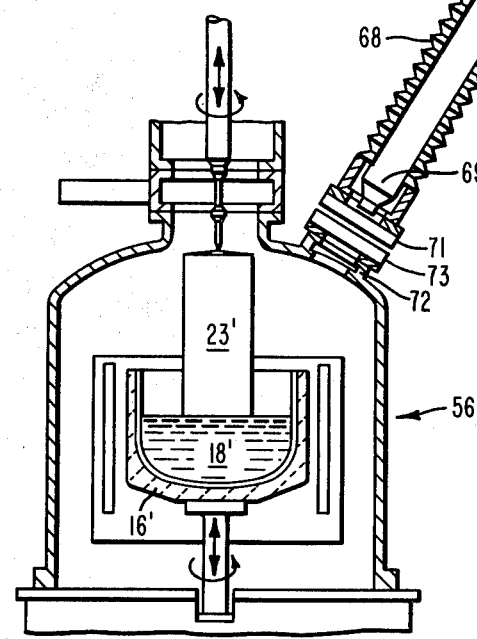
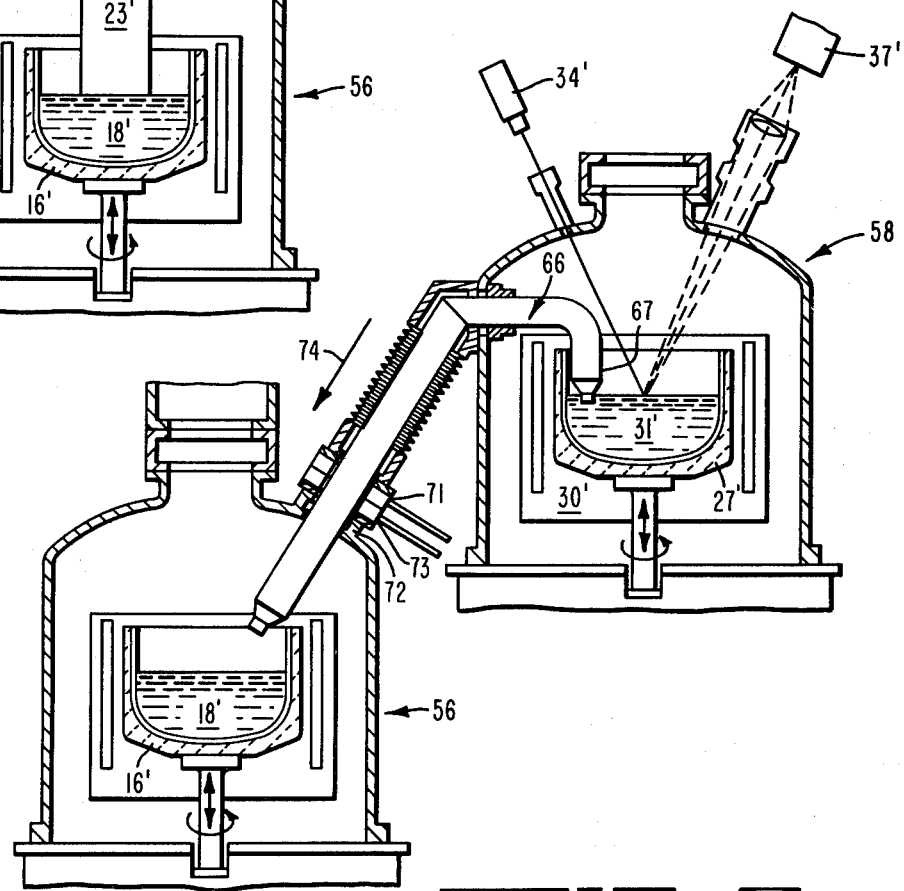
FIG_6

CRYSTAL GROWTH FURNACE RECHARGE

BACKGROUND OF THE INVENTION

The present invention relates to the formation of boules of semiconductor material from a melt of such material and, more particularly, to an improved method and means for replenishing molten material in a crucible from which, for example, monocrystalline boules of material are grown by the Czochralski process.

The growing of large, solid monocrystalline boules of a semiconductor material is of major importance in the production of semiconductor devices. Such monocrystalline boules are sliced into thin wafers which provide the substrate on which integrated circuitry is formed. Silicon is the most widely used semiconductor material from which boules are grown.

It is generally considered relatively expensive to form silicon wafers. For one thing, the monocrystalline boules from which they are formed must be grown under carefully monitored and controlled conditions. This expense adds not only to the cost of integrated circuitry, but also has inhibited the use of silicon wafers for other purposes, e.g., the photovoltaic conversion of solar energy directly to electricity.

It has been the general practice in the field to grow monocrystalline boules of silicon in a discontinuous, batch process. That is, most furnaces now in commercial use for this purpose typically include a single growth crucible containing a doped melt of silicon from which a boule is grown. The growth crucible is most often made of quartz so as to be relatively unreactive with the melted silicon contained by the same, and the crucible and its contents are heated to, and maintained at, a relatively high temperature, e.g., over 1400° C., during the growth process. After a boule is completely grown, the quartz crucible and the remaining silicon within it are allowed to cool so that another charge of silicon can be placed in the furnace for the growth of a succeeding boule. This cooling typically results in the crucible breaking or cracking because of the different thermal properties of silicon and the quartz of the crucible. In other words, a new crucible has to be installed in the furnace for the growth of each boule. The crucible cost and down-time associated with its replacement are major contributors to the overall expense of growing monocrystalline silicon boules.

Because of the above problems, significant attention has been give to the development of commercially viable furnace arrangements which enable a plurality of boules to be sequentially grown from a single growth crucible. One approach under consideration is the recharging of a growth crucible from a separate, replenishment crucible to which solid polycrystalline material can be added and melted. This replenishment of melted material from a separate crucible can either be accomplished continuously or intermittently as the need warrants. U.S. Pat. No. 4,036,595 and copending U.S. patent application Ser. Nos. 82,640 and 83,169, all of which are owned by the assignee of this application, exemplify the state-of-the-art on this approach.

While the advantages of replenishment of silicon as a liquid melt from a separate replenishment crucible are apparent, so is one disadvantage. The provision of a separate replenishment crucible for a crystal growth furnace adds to the furnace capital cost due to the duplication of parts inherent in the provision of two separate crucibles. Besides the crucible duplication, itself, separate heating structures, height adjustment and rotational motive means, etc., must be provided for each.

SUMMARY OF THE INVENTION

The present invention significantly reduces the capital costs associated with the dual crucible approach to the formation of a plurality of boules from a single growth crucible. It accomplishes this by utilizing a single replenishment crucible to recharge a plurality of growth crucibles. Moreover, it provides intermittent communication of a replenishment crucible with one or more growth crucibles for recharging the latter with molten material as boules are sequentially grown.

The invention includes other features and advantages which will be described or will become apparent from the following more detailed description of preferred embodiments.

BRIEF DESCRIPTION OF THE DRAWINGS

With reference to the accompanying four sheets of drawing:

FIG. 1 is a schematic sectional and block diagram view of a preferred embodiment of the invention in which a single replenishment crucible is being used to replenish a plurality of growth crucibles;

FIG. 2 is a schematic sectional view showing a stationary arrangement in which a single replenishment crucible is communicably connected individually with a plurality of growth crucibles;

FIG. 3 is a schematic sectional view showing a stationary arrangement in which a single replenishment crucible is serially connected with a plurality of growth crucibles to replenish the same;

FIGS. 5 and 6 are partial side elevation views of the arrangement shown in FIG. 4; and FIG. 7 is a schematic sectional view of an alternate preferred embodiment for communicating a portable replenishment crucible with one of a plurality of growth crucibles.

DETAILED DESCRIPTION OF PREFERRED EMBODIMENTS

Figure 4:
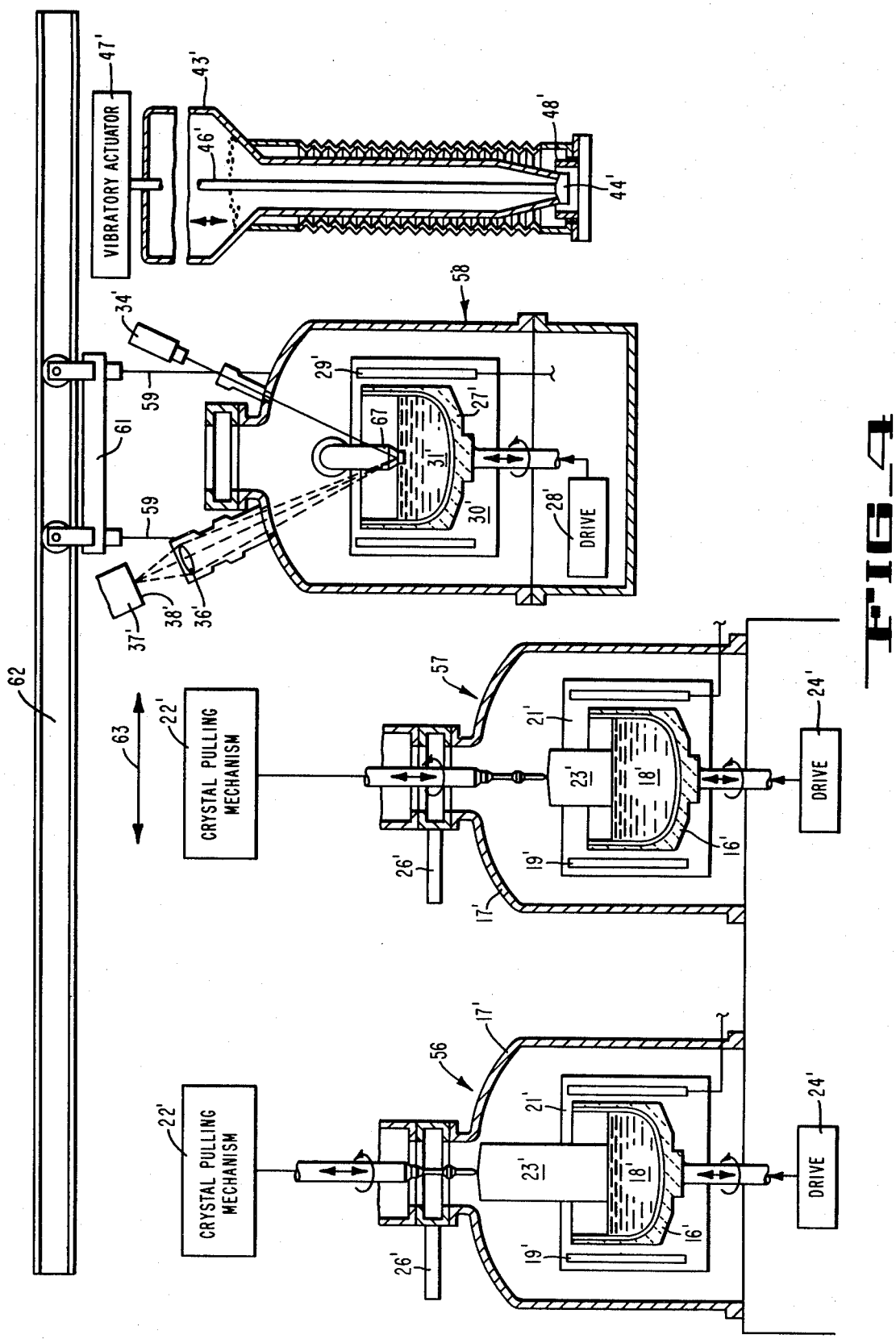
FIG. 4 is a schematic sectional and block diagram view showing a preferred embodiment of the invention in which a replenishment crucible is portable between a plurality of growth crucibles.

FIG. 1 is a schematic sectional view of two crystal growing furnaces arranged to be replenished by a single, stationary replenishment furnace. That is, a pair of crystal growing furnaces, generally referred to by the reference numerals 12 and 13, respectively, are positioned on opposite sides of a replenishment furnace 14. Each of the growth furnaces 12 and 13 is conventional in nature. That is, each includes a growth crucible 16 which is mounted for both rotation and vertical movement within an isolation chamber 17. A melt 18 of doped silicon is contained in each crucible. And each of such crucibles is surrounded by a radiant heating structure represented at 19, in turn encompassed within a heat shield 21.

Each of the furnaces 12 and 13 further includes a crystal pulling mechanism represented at 22 for slowly withdrawing a seed crystal from the melt within the crucible 16 to form a monocrystalline cylindrical boule 23. In accordance with conventional practice, the crystal pulling mechanism 21 rotates the growing crystal as it is slowly formed. Drive mechanism represented at 24 is also included as part of each furnace for rotating the respective crucibles 16 during the growth of a boule and for also moving such crucibles vertically upward and downward. Each of the furnaces 12 and 13 also includes a valving mechanism represented by gate valve 26 for isolating the atmospheres in the interiors of the chambers 17 from the atmospheres in the upper portions of the furnaces. In this connection, although not shown, it is contemplated that the upper portion of each of the furnaces has sufficient vertical height to accommodate a fully grown boule of a desired length.

In operation, the interior of each of the chambers 17 is provided with an inert atmosphere, e.g., with argon gas, maintained at a pressure in the order of 30-40 torr. The melts 18 are appropriately doped to provide the desired electrical properties to the boules grown therefrom. As each of the boules is grown, the crucibles 16 are rotated relative to the heater structure 19 to assure, among other things, uniform heating of the melt. And it is common to move a growth crucible vertically relative to a growing boule for further control of growing conditions.

As mentioned previously, in most commercial furnace arrangements a melt is supplied to a growth crucible by placing unmelted silicon in the form of chunks, rods, powder, etc. directly into the crucible, then melting the same with the heater structure. The instant invention provides a method and apparatus for furnishing melt to the growth chambers of a plurality of furnaces, without the necessity of the same periodically being filled with unmelted material. In this connection, the replenishment furnace 14 includes a replenishment crucible 27 which is, in essence, the same as a growth crucible. Crucible 27 is mounted within its furnace for both rotation and vertical movement, and drive mechanism represented at 28 is furnished to provide such movement. Drive mechanism 28 can be the same as the drive mechanisms 24. Heater structure represented at 29 similar to the heater structures 19 is furnished surrounding the crucible 27, and a heat shield 30 akin to the heat shields 21 is also provided. A supply of molten semiconductor material 31 is shown contained within replenishment crucible 27.

In keeping with the invention, means are provided communicating the supply of material 31 in replenishment crucible 27, separately with each of the growth crucibles 16 of the two furnaces 12 and 13. It is preferred that such means be in the form of a pair of siphon tubes or conduits 32 and 33. Most desirably, each of such conduits has a construction conforming to the construction of the conduit described and claimed in copending patent application Ser. No. 82,640. That is, each includes an inner transfer tube made of quartz, surrounded by a surface extensive heater to provide uniform heating along its length. A thermal insulating and reinforcing shell encompasses the transfer tube and heater.

Most desirably, each of the conduits 32 and 33 communicates the replenishment crucible with the respective growth crucibles, at locations below the level of molten material in each. That is, in this preferred embodiment the ends of the quartz transfer tube of each extend beyond the respective ends of the heater and insulating structure and are immersed within the molten material in the two crucibles. In accordance with the invention of copending patent application Ser. No. 82,640, the heater structure adjacent such ends is designed to provide increased heat input per unit area to heat by conduction the bare ends of the quartz transfer tube and thereby inhibit solidification of the molten material at such ends.

It will be appreciated that with the above arrangement in which the conduits 32 and 33 act, in essence, as siphon conduits, the surface levels of molten material 18 within the growth crucibles will automatically follow any changes in the surface level of molten material in the replenishment crucible. The level of the supply of molten material in the replenishment crucible is utilized to control the amount of molten material which flows from the replenishment crucible into each of the growth crucibles. In this connection, means are provided for sensing the level of molten material in the replenishment crucible and generating an information signal representative of such level. Most desirably, an optical melt level sensing means is provided for performing this function. It includes a source of a highly collimated beam of light, such as that generated by a ruby laser represented at 34. The light output from laser 34 passes through an optically transparent vacuum tight port into the interior of the replenishment crucible chamber to strike the surface of the melt 31 and be reflected to a converging lens 36 which focuses the same on a position sensor 37. Sensor 37 may be of any known type which will give an output signal indicative of the position of impingement of the beam transversely along its sensing surface.

The point of impingement of the light beam on the position sensing surface 38 of sensor 37 is a function of the level of the melt 31. Thus, the signal generated by the sensor 37 representative of the location at which it receives the reflected beam, is an information signal representative of the level of molten material within the replenishment crucible. This information signal is utilized to control the amount of molten material flowing from the replenishment crucible 27 to each of the growth crucibles 16. It is fed to electronic circuitry represented by feedback controller box 39 which produces control signals directed as represented by lines 41 and 42 to means for adding unmelted silicon to crucible 27 and to drive 28 for raising and lowering such crucible, respectively. The means for adding unmelted semiconductor material to the replenishment crucible includes a hopper 43 within which chunks or powder of the unmelted material is contained. The hopper terminates at its lower end in an outlet which is closed by a valve plate 44, connected via an actuating rod 46 to a vibrator mechanism represented at 47. In accordance with conventional practice, flow of material from hopper 43 is controlled by vertical oscillation of the rod 46 and, hence, of valve plate 44. The timing of such oscillation, including its rate, is a function of the control signal received from controller 39 on line 41. In other words, the rate of addition of unmelted material to the replenishment crucible is determined by the control signal on line 41 which is, in turn, a function of the information signal emanating from sensor 37 indicative of the level of melt 31 in crucible 27. It should be noted that a splash shield 48 of quartz circumscribes the outlet of the hopper 43 to isolate any surface disturbances in the melt due to the addition of the solid material, from the transfer conduits 32 and 33.

It will be recognized from the above that addition of unmelted material to the hopper 27 for subsequent melting will change the level of the melt 31. This change will automatically be followed by corresponding changes in the level of the melts 18 in the growth crucibles 16. The position of the surface level of melt 31 also can be changed to control the surface level of melts 18 by varying the vertical position of the crucible 27. A control signal on line 42 from controller 39 can be used to define such crucible position for such purpose.

The level of melt in the growth crucibles can be controlled either simultaneously or separately by the addition of semiconductor material to be melted to the replenishment crucible and by control of the height of the crucible. At the end of a production run, it is desirable to control such level only by raising crucible 27 to empty the same of remaining melted semiconductor material without deleteriously affecting the melt level in the growth crucible 16. It will be appreciated that the relationship of the pressure within the replenishment chamber to the pressures within the growth chambers also can be changed to vary the level of the surface of the melts in the growth chambers relative to the replenishment crucible.

It will be seen from the above that the invention enables a plurality of growth crucibles to be replenished from a single replenishment crucible. This reduces the capital costs associated with the "dual crucible" approach to replenishment. Moreover, it enables the melt level of one or more growth crucibles to be controlled by an information signal representative of the level of material in the replenishment crucible.

Although the arrangment just described has only a pair of growth crucibles, the invention is applicable to use of a single replenishment crucible with any number of growth crucibles. FIG. 2 is a top sectional view illustrating a crucible layout in which a single replenishment crucible 50 feeds melted semiconductor material individually via five transfer tubes 51 to five different growth crucibles 52. A single level sensing mechanism for the replenishment crucible can be used to control the amount of molten material which flows into all five of such growth crucibles.

FIG. 3 is a top sectional view similar to Fig. 2, but illustrating a single replenishment crucible 53 communicating with a plurality of growth crucibles in a serial fashion. That is, replenishment crucible 53 communicates directly with a first growth crucible 54 via a transfer tube 55. The first growth crucible 54 is communicated in turn with a second growth crucible 54' via a second transfer tube 55', and a third growth crucible 54" is similarly communicated via a third transfer tube 55" with such second growth crucible 54'. This series communication of the growth crucibles has the advantage of inhibiting contaminant buildup in the melt contained in at least the first one of such growth crucibles. That is, all melt required by growth crucibles subsequent in line to crucible 54, for example, must first pass through such crucible. This increased rate of exchange of the melt within crucible 54 reduces contaminant buildup and, hence, increases the number of boules which can be grown without the necessity of contaminant removal. Again, a single level-sensing mechanism for replenishment crucible 53 controls the amount of material which flows into the growth crucibles or, in other words, the melt level in all of the same.

In the arrangements described thus far, the replenishment crucible is stationary with respect to the growth crucibles. This, however, is not necessary. That is, it is contemplated that the replenishment crucible be portable with respect to the growth crucibles and be communicable with each only intermittently for replenishment. FIGS. 4, 5 and 6 schematically illustrate one such arrangement in which a portable replenishment furnace is suspended for movement between a plurality of growth crucibles. A pair of crystal growth furnaces 56 and 57 are illustrated which are essentially the same as furnaces 12 and 13 of the embodiment of FIG. 1. In this connection, the parts of such furnaces are referred to by the same reference numerals as used in FIG. 1, except for the fact that such reference numerals are primed.

The replenishment furnace 58 of the embodiment of FIGS. 4, 5 and 6, is the same as replenishment crucible 14 of the embodiment shown in FIG. 1, except for the fact that the hopper and its attendant equipment are mounted exteriorly of the replenishment crucible in a fixed location as illustrated. The replenishment furnace and hopper are otherwise the same as the earlier described embodiment, and like parts are referred to by like, but primed, reference numerals.

Replenishment furnace 58, including the replenishment crucible 31 and its associated chamber, are suspended for movement as a unit between the two furnaces 56 and 57. It is hung by cables 59 (only two of which are shown in FIG. 4) from a carriage 61 on tracks or the like so that such furnace is movable with respect to such carriage horizontally both into and out of the drawing, and vertically. Carriage 61 is in turn suspended by rollers from a pair of track rails 62 (only one of which is illustrated in FIG. 3) to enable horizontal movement of the furnace in directions transversely of the drawing as represented by arrow 63.

Communication between the replenishment crucible of furnace 58 and either of the crucibles 16' of the furnaces 56 and 57 is effected via a transfer conduit 66. The construction of conduit 66 is similar to the constructions of the transfer conduits 32 and 33 of the FIG. 1 embodiment. However, its configuration is different. As is illustrated, it is permanently secured to the replenishment furnace with one of its ends, end 67, in communication with the melt 31' within the replenishment crucible. Conduit 66 extends through an elongated chamber sleeve 68 which encompasses the same and maintains it and the remainder of the interior of the isolation chamber of the replenishment furnace isolated from the ambient atmosphere. In this connection, the free end of sleeve 68 terminates slightly beyond the corresponding end 69 of the transfer conduit, and its opening is normally closed by, for example, a vacuum valve 71.

To replenish the melt in the growth crucible 16' of either of the growth furnaces 56 and 57, the replenishment furnace 58 is moved to align the free end of the chamber sleeve 68 with an access port provided for this purpose in the chamber of the growth furnace to be replenished. FIG. 5 illustrates the alignment of such chamber sleeve with such an access port 72 of growth furnace 56. Such access port is provided with a vacuum valve represented at 73 for normally closing the same. However, when communication between the replenishment and growth furnaces is desired for crucible replenishment, the valves 71 and 73 are connected together and opened as is represented in FIG. 6. Furnace 58 is then movable in the direction of arrow 74 to axially collapse the bellows of sleeve 68 and project conduit 66 into the chamber of furnace 56 to the location of the crucible 16' therein. Flow of melted semiconductor material can then be initiated from the replenishment crucible into the growth crucible. In this connection, the surface level of the material within the replenishment crucible is monitored to provide an information signal for control of such flow. It is important, as mentioned previously, that the flow be controlled in order to inhibit splashing and the like which may result in damage to the interior structure of furnace 56.

When the growth crucible has been replenished, the replenishment crucible can be disconnected from the same by reversing the operation discussed above. That is, the replenishment furnace is moved in the direction opposite to that represented by arrow 74 to withdraw the transfer conduit from the furnace 56, the valves 71 and 73 closed, and the chamber sleeve 68 disconnected from the growth chamber. The melt within the growth crucible 18' of the other growth furnace 57 is replenished the same way. And when it is necessary to replenish melt within the replenishment chamber, the replenishment furnace 58 can be appropriately moved for communication with the hopper 43'. As is illustrated, such hopper is provided with a bellows sleeve appropriately closed with a valve encompassing the hopper outlet to enable the latter to be introduced into the replenishment furnace without it interfering with the environmental isolation provided thereby.

It should be noted that although only two growth furnaces are illustrated in FIGS. 4-6, a greater number can be provided and served with the replenishment furnace 58.

FIG. 7 illustrates an arrangement in which a replenishment furnace 81, including its replenishment crucible, its isolation chamber, and the transfer conduit, are all mounted on a trailer 82 for the desired movement. As is illustrated, communication with a growth furnace for replenishment of semiconductor material is achieved via a chamber sleeve 86 communicating with a side access port 87 to enable a transfer conduit 88 to be projected into the growth furnace. The position of the replenishment furnace relative to the growth furnace during replenishment is illustrated in phantom. The replenishment and growth furnaces of this embodiment are made the same as the replenishment and growth furnaces of earlier embodiments, except as otherwise noted above. And it will be appreciated that the growth furnace 83 is only one of a plurality of furnaces which are served by the replenishment furnace 81, and a suitable mechanism for supplying unmelted semiconductor material to the replenishment crucible, is provided.

The embodiments of the invention illustrated in FIGS. 4-7 provide intermittent communication of the replenishment crucible with selected growth crucibles for replenishment, rather than continuous communication as in the earlier embodiments. And although in the embodiments of FIGS. 1-3 the transfer conduits 32 and 33 provide continuous communication between the replenishment and respective growth crucibles, flow of material between the crucibles need not be continuous. For example, one or more of the crucibles can be selectively lowered to withdraw the melt within the same from the end of the transfer conduit, and thus interfere with the automatic siphoning effect. And changes can be made to the atmospheric pressure in the chambers differentially in order to change the relationship of the surface level of a melt relative to the others. Thus, whereas portable replenishment for a plurality of furnaces is necessarily limited to "recharge" replenishment, a stationary replenishment furnace arrangement can provide either continuous or recharge replenishment.

Although the invention has been described in connection with preferred embodiments, it will be appreciated by those skilled in the art that various changes and modifications can be made. And various features of the invention need not necessarily be used in combination with other features of the invention. It is therefore intended that the coverage afforded applicant be limited only by the terms of the claims and their equivalent language.

We claim:

1. Apparatus for replenishing molten semiconductor material in a plurality of growth crucibles from which one or more solid boules of such material are to be formed, comprising:
   A. a plurality of growth crucibles;
   B. a single replenishment crucible for said growth crucibles, physically distinct from said crucibles and within which a supply of said material can be melted and maintained in a molten condition;
   C. means for feeding unmelted semiconductor material to said replenishment crucible, located at a stationary position relative to said replenishment crucible; and
   D. means for moving said replenishment crucible between the locations of each of said growth crucibles to position said replenishment crucible for the flow of said material from said replenishment crucible separately to each of said growth crucibles; wherein a separate isolation chamber is provided for said replenishment crucible and for each of said growth crucibles for maintaining the molten material therein isolated from the ambient atmosphere; and said means for communicating said growth and replenishment crucibles includes a conduit extending outwardly from said replenishment crucible into a sleeve of its associated isolation chamber, which sleeve encompasses said conduit when said conduit is not in communication with a growth crucible, is connectable to an isolation chamber enclosing a growth crucible, and is axially collapsible to permit the projection of said conduit into said growth crucible chamber to the location therein of said crucible for said communication.

* * * * *